US009129923B1

(12) United States Patent
Han et al.

(10) Patent No.: US 9,129,923 B1
(45) Date of Patent: Sep. 8, 2015

(54) ORGANIC LIGHT EMITTING DISPLAY AND REPAIRING METHOD OF THE SAME

(71) Applicant: LG Display Co., Ltd., Seoul (KR)

(72) Inventors: Jeon-Phill Han, Seoul (KR); Ho-Jin Ryu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/446,051

(22) Filed: Jul. 29, 2014

(30) Foreign Application Priority Data

May 8, 2014 (KR) .......................... 10-2014-0054743

(51) Int. Cl.
*H01L 29/08* (2006.01)
*H01L 27/32* (2006.01)
*H01L 51/56* (2006.01)
*G09G 3/32* (2006.01)

(52) U.S. Cl.
CPC .......... *H01L 27/3248* (2013.01); *G09G 3/3225* (2013.01); *H01L 27/3211* (2013.01); *H01L 27/3276* (2013.01); *H01L 51/56* (2013.01); *G09G 2320/0233* (2013.01); *G09G 2330/08* (2013.01); *H01L 2227/323* (2013.01)

(58) Field of Classification Search
CPC ......... H01L 51/50; H01L 51/52; H01L 51/56; H01L 29/6675; H01L 29/786; H01L 27/3248; H01L 27/3276; H01L 27/3211; G09G 3/3225
USPC ........................ 257/40, 59, E51.018; 345/690
See application file for complete search history.

(56) References Cited

U.S. PATENT DOCUMENTS

2014/0292827 A1* 10/2014 Kang et al. .................... 345/690

* cited by examiner

*Primary Examiner* — Shaun Campbell
(74) *Attorney, Agent, or Firm* — Fenwick & West LLP

(57) ABSTRACT

A repair path is established between a sub-pixel with a defective drive transistor and another sub-pixel with an operable drive transistor to connect storage capacitors in the two sub-pixels in parallel. Another repair path is established to operate a light emitting device by the operable drive transistor of the second sub-pixel. Terminals of the storage capacitors in the two pixels are connected to a gate of the operable drive transistor. The voltage at the terminals of the storage capacitors are maintained above the threshold voltage of the operable drive transistor is switched on for a longer time due to the combined capacitance of the two storage capacitance. Hence, the sub-pixel with the defective drive transistor and the other sub-pixel of the operable drive transistor remain turned on for a longer time. Hence, despite providing a lower level of current to each of the light emitting devices in the two sub-pixels, the intensity of light produced remains relatively high due to increased turn on time of the operable drive transistor.

19 Claims, 17 Drawing Sheets

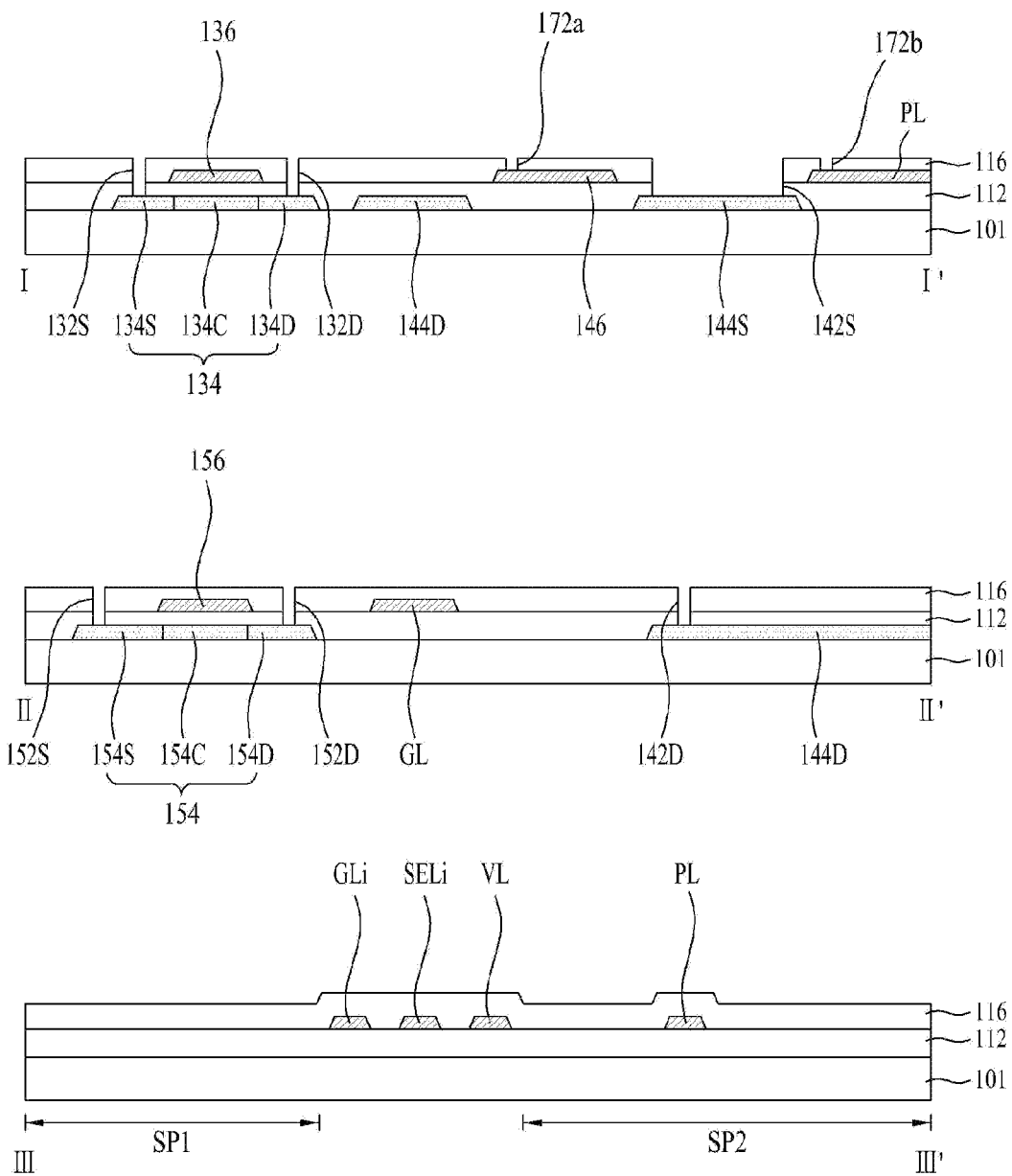

ORGANIC LIGHT EMITTING DISPLAY AND REPAIRING METHOD OF THE SAME

CROSS-REFERENCE TO RELATED APPLICATION

This application claims the benefit of Korean Patent Application No. 10-2014-0054743, filed on May 8, 2014, which is hereby incorporated by reference as if fully set forth herein.

BACKGROUND OF THE INVENTION

1. Field of the Invention

The present invention relates to an organic light emitting display and a repairing method of the same and, more particularly, to an organic light emitting display with reduced brightness deviation and change over time and a repairing method of the same.

2. Discussion of the Related Art

Image display devices are core technology in information communication era and are used to display various kinds of information on a screen. Advancement have been made to use image display devices that are thinner, lighter, and portable and have higher performance. An organic light emitting display that controls a luminance amount of an organic emission layer to display an image has been spotlighted as a flat panel display having smaller weight and volume than a cathode ray tube (CRT).

An organic light emitting display includes a plurality of sub-pixels arranged in a matrix form to display an image. Each sub-pixel includes a light emitting device and a pixel driver including a plurality of transistor to independently drive the light emitting device. During formation of each transistor included in the pixel driver, source and drain electrodes may not be separated from each other due to poor patterning of the source and drain electrodes or conductive foreign matter may remain at a thin film transistor region.

As a result, the transistor may be defective. When a sub-pixel has such a defective transistor, a repairing process is performed to connect the defective sub-pixel to a normal sub-pixel adjacent to the defective sub-pixel such that current is distributed from the normal sub-pixel to the defective sub-pixel. When current is distributed from the normal sub-pixel to the defective sub-pixel, however, the amount of current flowing in the normal sub-pixel and the defective sub-pixel connected to each other through the repairing process is reduced to about ½ the amount of current flowing in another normal sub-pixel which is not adjacent to the defective sub-pixel, which causes brightness deviation and change over time.

SUMMARY OF THE INVENTION

Embodiments relate to an organic light emitting display including repair pattern formed between sub-pixel regions. A gate line and a data line is provided on a substrate and are arranged to intersect with each other and define a first sub-pixel region in the organic light emitting display. A light emitting device is formed in the first sub-pixel region. The light emitting device has an anode and a cathode. A switching transistor in the first sub-pixel region supplies data voltage of the data line to a first node in response to applying a scan signal to the gate line. A drive transistor is provided in the first sub-pixel region. The drive transistor controls emission of the light emitting device according to the voltage of the first node. A storage capacitor is provided in the first sub-pixel region. The storage capacitor includes a first terminal connected to the first node and a second terminal connected to a second node connected to the anode. The repair pattern is formed between the first node of the first sub-pixel region and another first node of a second sub-pixel region adjacent to the first sub-pixel region.

In one or more embodiments, the repair pattern includes a first repair pattern and a second repair pattern. The first repair pattern is formed between the second node of the first sub-pixel region and another second node of the second sub-pixel region. The second repair pattern us formed between the first node of the first sub-pixel region and the other first node of the second sub-pixel region. The first and second repair patterns are formed of the same material as the anode and are formed on the same layer as the anode.

In one or more embodiments, the second repair pattern includes a connection part and sharing parts. The connection part is formed between data lines or gate lines located between the first and the second sub-pixel regions for producing different colors. The sharing parts extend from both sides of the connection part to overlap with a storage capacitor of the second sub-pixel region and a storage capacitor of a third sub-pixel region.

In one or more embodiments, when the drive transistor of the first sub-pixel region is defective, a path between the storage capacitor and the drive transistor of the first sub-pixel region is disconnected, the anode of the first sub-pixel region and an anode of the second sub-pixel region via the first repair pattern is connected, and the storage capacitor of the first sub-pixel region and a storage capacitor of the second sub-pixel are connected in parallel via the second repair pattern.

In one or more embodiments, the organic light emitting display further includes a repair capacitor in the first sub-pixel region. The repair capacitor is connected in parallel to the storage capacitor of the first sub-pixel region when the drive transistor of the first sub-pixel region is defective.

Embodiments also relate to an organic light emitting display including a first sub-pixel, a second sub-pixel and a repair path. The first sub-pixel includes a first light emitting device, a defective drive transistor connected to the first light emitting device, and a first storage capacitor having a first terminal and a second terminal. The first terminal is connected to the first light emitting diode. The second sub-pixel is adjacent to the first sub-pixel and includes a second light emitting device, an operable drive transistor between a reference voltage and the second light emitting device, and a second storage capacitor having a first terminal connected to the second light emitting diode and a second terminal connected to a gate of the operable drive transistor. The repair path connects the second terminal of the first storage capacitor to the second terminal of the second storage capacitor.

In one or more embodiments, the second sub-pixel further includes a switching transistor coupled between a data line and the operable drive transistor. The switching transistor has a gate connected to a gate line. The second terminal of the second storage capacitor is further connected to the switching transistor.

In one or more embodiments, the organic light emitting display further includes another repair path connecting the first terminals of the first and second storage capacitors.

In one or more embodiments, the first sub-pixel further includes a switching transistor coupled between a data line and the defective drive transistor. The second terminal of first storage capacitor is disconnected from a gate of the defective drive transistor.

In one or more embodiments, the repair path includes welding.

In one or more embodiments, the first and second sub-pixels are connected to a same data line.

In one or more embodiments, the first and second sub-pixels are connected to a same gate line.

In one or more embodiments, at least one of the first sub-pixel and the second sub-pixel include a repair capacitor connected in parallel to the first storage capacitor or the second storage capacitor.

Embodiments also relate to a method of repairing an organic light emitting display. If is determined if a first drive transistor in a first sub-pixel is defective. If the first drive transistor is determined as defective, a terminal of a first storage capacitor of the first sub-pixel is connected to a corresponding terminal of a second storage capacitor in a second sub-pixel. The second sub-pixel is adjacent to the first sub-pixel and has an operable drive transistor. The operable drive transistor of the second sub-pixel operated by voltage at the terminal of the first storage capacitor and the corresponding terminal of the second storage capacitor. Current through a first light emitting device of the first sub-pixel and a second light emitting device is provided through the operable drive transistor. The terminal of the first storage capacitor is disconnected from a gate of the first drive transistor.

In one or more embodiments, the terminal of the first storage capacitor is connected to the corresponding terminal of the second storage capacitor by performing welding on a repair path between the first sub-pixel and the second sub-pixel.

In one or more embodiments, the second drive transistor is connected to another terminal of the first storage capacitor and the first light emitting device.

In one or more embodiments, the second drive transistor is connected by performing welding on a repair path between the first sub-pixel and the second sub-pixel.

In one or more embodiments, the terminal of the first storage capacitor is disconnected by performing laser cutting on a path between the terminal and a gate of the first drive transistor.

In one or more embodiments, a repair capacitor in parallel with at least one of the first storage capacitor and the second storage capacitor is connected responsive to determining that the first drive transistor is defective.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 8A through 8G are sectional views illustrating a manufacturing method of an organic light emitting display according to an embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
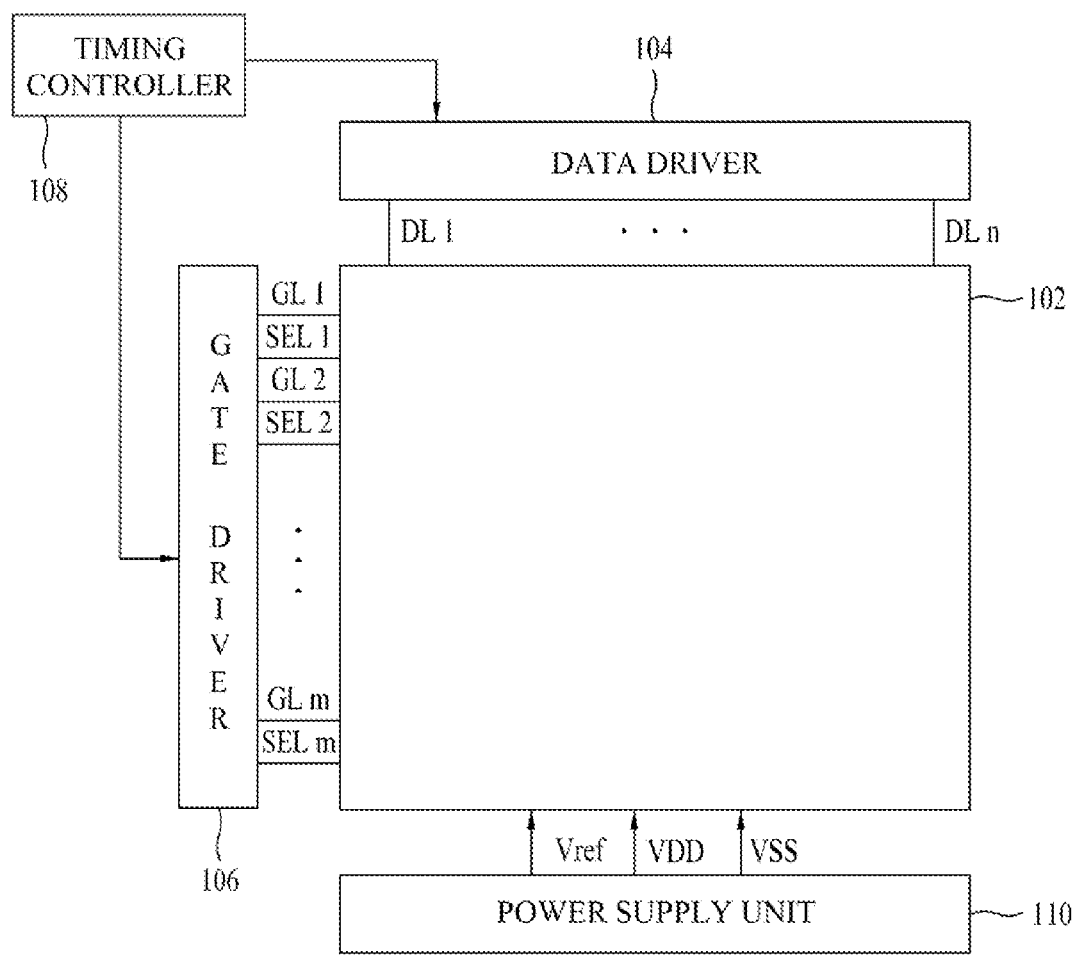
FIG. 1 is a block diagram showing an organic light emitting display according to a first embodiment of the present invention.

FIG. 1 is a block diagram showing an organic light emitting display according to a first embodiment of the present invention. The organic light emitting display includes a light emitting display panel 102, a data driver 104, a gate driver 106, a timing controller 108, and a power supply unit 110.

The timing controller 108 generates a plurality of control signals to control drive timing of the gate driver 106 and the data driver 104, arranges pixel data, and supplies the pixel data to the data driver 104. The control signals generated by the timing controller 108 include a gate control signal to control drive timing of the gate driver 106 and a data control signal to control drive timing of the data driver 104.

The gate driver 106 sequentially generates a plurality of scan pulses and sensing pulses in response to the gate control signal from the timing controller 108. The gate driver 106 sequentially supplies the scan pulses to gate lines GL1 to GLm formed at the light emitting display panel 102 and sequentially supplies the sensing pulses to sensing lines SEL1 to SELm.

The data driver 104 converts digital type pixel data into analog type data voltage using the control signal from the timing controller 108 and gamma voltage and supplies the converted analog type data voltage to data lines DL.

The power supply unit 110 generates and supplies reference voltage Vref, high-potential voltage VDD, and low-potential voltage VSS necessary to drive each sub-pixel to each pixel using external input power.

Figure 2:
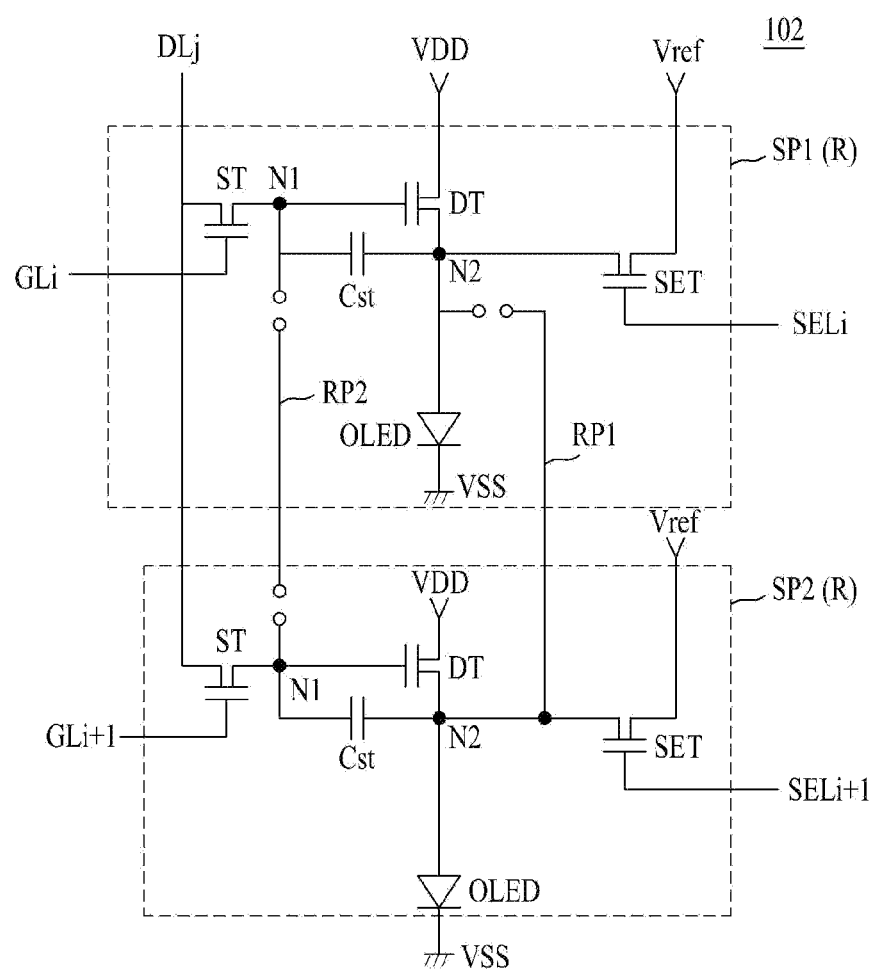
FIG. 2 is a view illustrating a pixel circuit of the organic light emitting display shown in FIG. 1.

As shown in FIG. 2, the light emitting display panel 102 includes a plurality of data lines DL and a plurality of gate lines GL intersecting with each other and sub-pixels SP1 and SP2 arranged in a matrix form. Each sub-pixel SP includes a light emitting device OLED, a drive transistor DT to supply drive current to the light emitting device OLED, a switching transistor ST, a sensing transistor SET, and a storage capacitor Cst.

Figure 3:
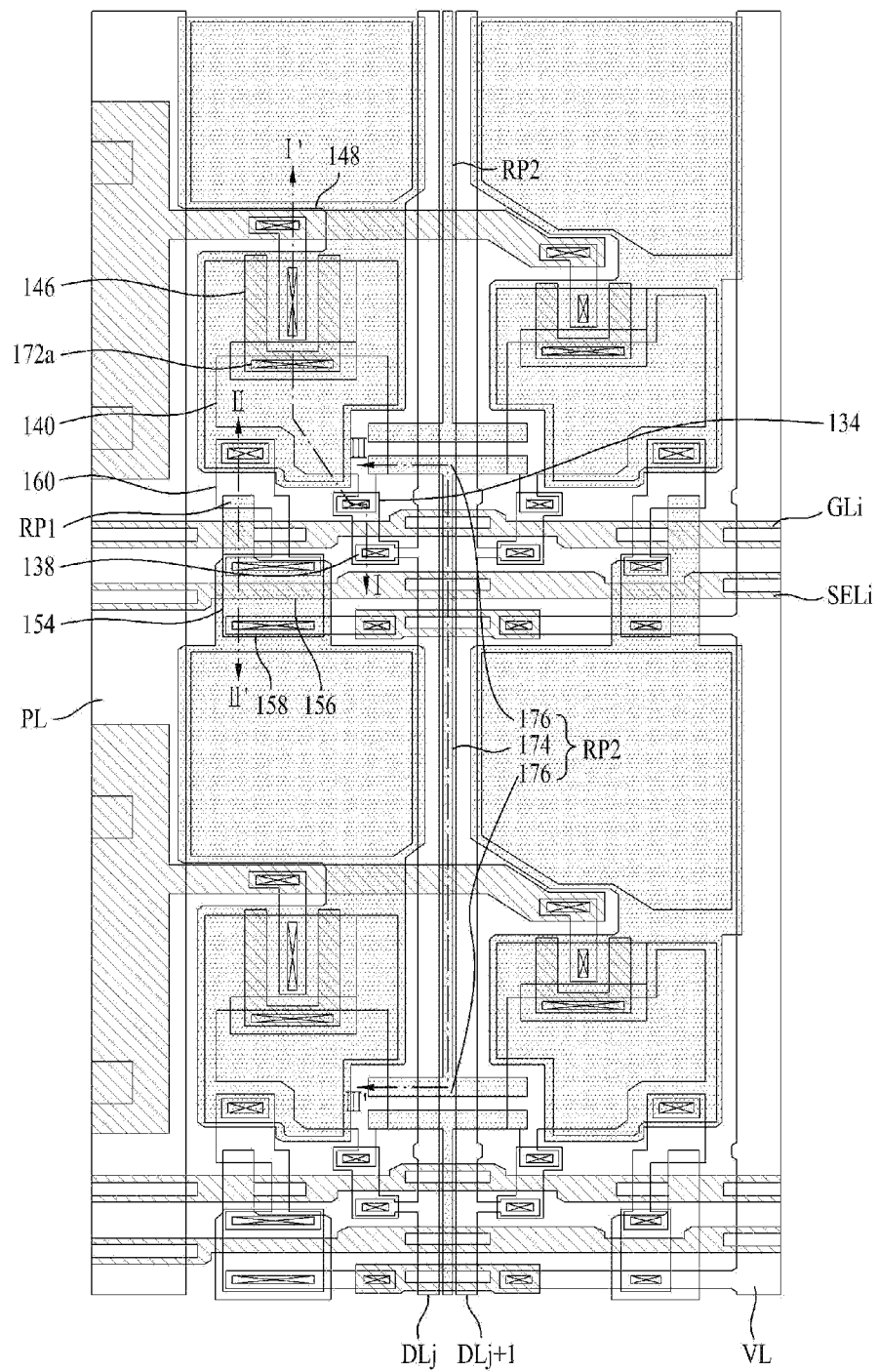
FIG. 3 is a plan view of the pixel circuit shown in FIG. 2.
Figure 4:
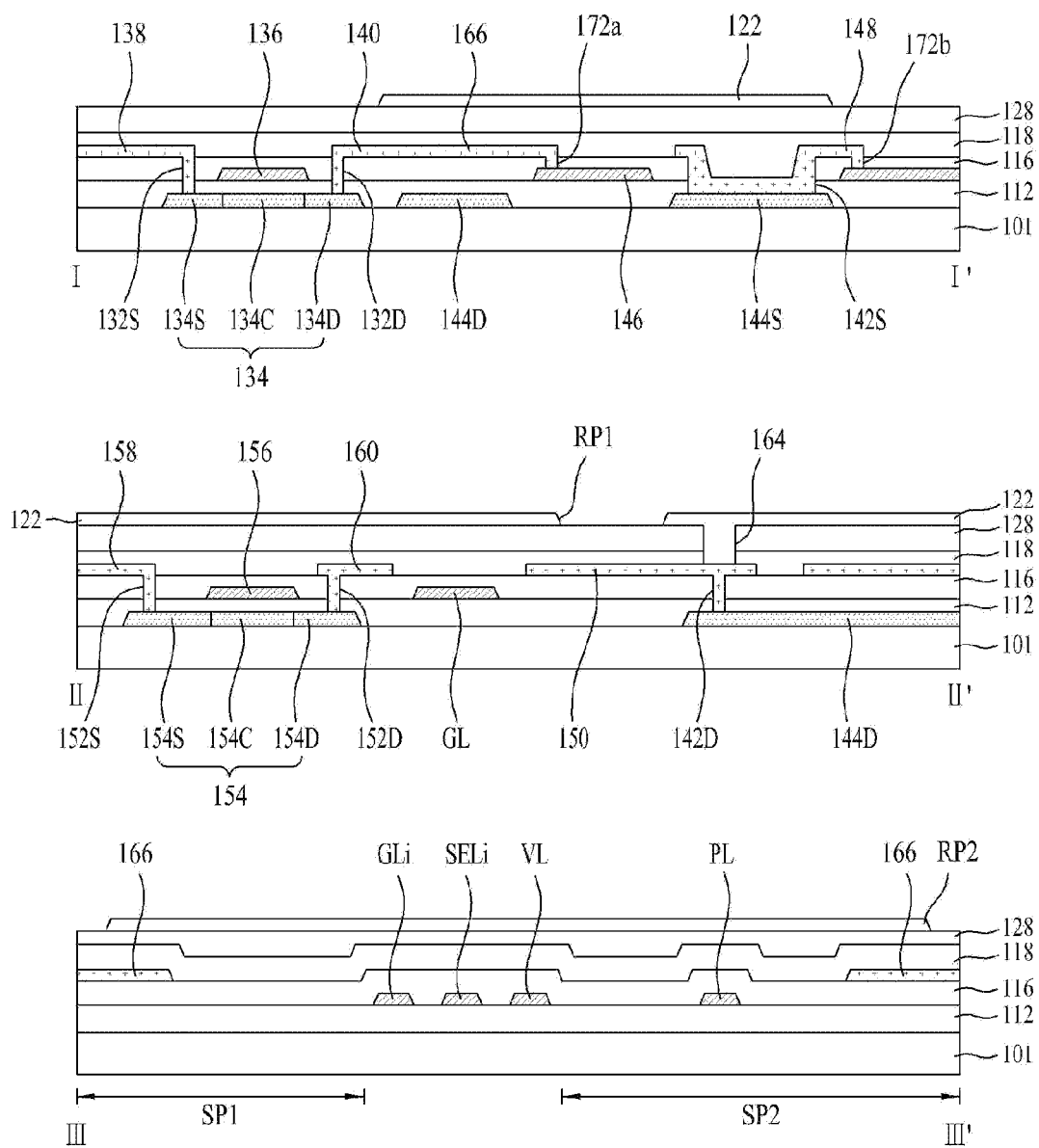
FIG. 4 is a series of sectional views taken along lines I-I', II-II', and III-III' of FIG. 3.

When a scan pulse is supplied to the gate line GL, the switching transistor ST is turned on. In response, the data line DL is connected via the switching transistor ST to the storage capacitor Cst and a gate electrode of the drive transistor DT. As illustrated in FIGS. 3 and 4, the switching transistor ST1 includes a first gate electrode 136 connected to the gate line GL, a first source electrode 138 connected to the data line DL, a first drain electrode 140 connected to a second gate electrode 146 of the drive transistor DT and the storage capacitor Cst, and a first active layer 134. The first drain electrode 140 is at an opposite side of the first source electrode 138. A channel is formed between the first source electrode 138 and the first drain electrode 140.

The first active layer 134 is formed with a first channel region 134C, a first source region 134S, and a first drain region 134D separated from the first source region 134S by the first channel region 134C. The first channel region 134C overlaps with the first gate electrode 136 with a gate insulation film 112 in-between. The first source region 134S is doped with an n-type or p-type dopant. The first source region 134S is connected to the first source electrode 138 through a first source contact hole 132S extending through the gate insulation film 112 and an interlayer insulation film 116. The first drain region 134D is doped with an n-type or p-type dopant. The first drain region 134D is connected to the first drain electrode 140 through a first drain contact hole 132D extending through the gate insulation film 112 and the interlayer insulation film 116.

The drive transistor DT controls current to the light emitting device OLED according to the level of charge stored in the storage capacitor Cst. That is, the drive transistor DT control the level of current from a power supply line PL (at voltage level VDD) to the light emitting device OLED based on the charge stored in the storage capacitor Cst, and thereby adjusts the intensity of the light emitted from the OLED. To this end, as shown in FIGS. 3 and 4, the drive transistor DT includes a second gate electrode 146 connected to the first drain electrode 140 of the switching transistor ST1, a second source electrode 148 connected to the power supply line PL, a second drain electrode 150 connected to an anode 122 of a light emitting cell, and a second active layer 144S and 144D to form a channel between the second source electrode 148 and the second drain electrode 150.

The second gate electrode 146 is formed in a U shape. The second gate electrode 146 is connected to the first drain electrode 140 of the switching transistor ST1 through a first gate contact hole 172a extending through the interlayer insulation film 116 and. A channel region of the second active layer overlapping with the first gate contact hole 172a is removed such that the second active layer is exposed during formation of the first gate contact hole 172a to prevent the occurrence of a short circuit between the second gate electrode 146 and the second active layer.

The second source electrode 148 is connected to the power supply line PL through a second gate contact hole 172b extending through the interlayer insulation film 116 to expose the power supply line PL. In addition, the second source electrode 148 is connected to a second source region 144S through a second source contact hole 142S extending through the interlayer insulation film 116 and the gate insulation film 112 to expose the second source region 144S.

The second drain electrode 150 is exposed through a pixel contact hole 164 extending through first and second passivation films 118 and 128 and is connected to the anode 122. In addition, the second drain electrode 150 is connected to a second drain region 144D through a second drain contact hole 142D extending through the interlayer insulation film 116 and the gate insulation film 112 to expose the second drain region 144D.

A second channel region of the second active layer overlaps with the U-shaped second gate electrode 146 via the gate insulation film 112 excluding a region overlapping the first gate contact hole 172a. The second source region 144S is doped with an n-type or p-type dopant. The second source region 144S is connected to the second source electrode 148 through the second source contact hole 142S extending through the gate insulation film 112 and the interlayer insulation film 116. The second drain region 144D is doped with an n-type or p-type dopant. The second drain region 144D is connected to the second drain electrode 150 through the second drain contact hole 142D extending through the gate insulation film 112 and the interlayer insulation film 116.

When a sensing pulse is supplied to the sensing line SEL, the sensing transistor SET is turned on to sense voltage of a second node N2, i.e. threshold voltage of the drive transistor DT and threshold voltage of the light emitting device OLED. That is, when the sensing transistor SET is turned on, a current path is formed through the second node N2, the sensing transistor SET, and a reference voltage line VL at reference voltage Vref. The data driver 104 and the timing controller 108 sense current flowing through the current path to sense the threshold voltage of the drive transistor DT and the threshold voltage of the light emitting device OLED. Data voltage is compensated based on the sensed threshold voltage and the compensated data voltage is supplied to the data line DL.

To this end, as shown in FIGS. 3 and 4, the sensing transistor SET includes a third gate electrode 156 connected to the sensing line SEL, a third source electrode 158 connected to the reference voltage line VL, a third drain electrode 160 at an opposite side of the third source electrode 158, and a third active layer 154S and 154D to form a channel between the third source electrode 158 and the third drain electrode 160.

The third gate electrode 156 is connected to the sensing line SEL parallel to the gate line GL. The third source electrode 158 is connected to a third source region 154S through a third source contact hole 152S extending through the interlayer insulation film 116 and the gate insulation film 112 to expose the third source region 154S. The third drain electrode 160 extends from the second drain electrode 150 of the drive transistor. The third drain electrode 160 is connected to a third drain region 154D through a third drain contact hole 152D extending through the interlayer insulation film 116 and the gate insulation film 112 to expose the third drain region 154D.

A third channel region 154C of the third active layer 154 overlaps with the third gate electrode 156 via the gate insulation film 112. The third source region 154S is doped with an n-type or p-type dopant. The third source region 154S is exposed through the third source contact hole 152S extending through the gate insulation film 112 and the interlayer insulation film 116 and is connected to the third source electrode 158. The third drain region 154D is doped with an n-type or p-type dopant. The third drain region 154D is exposed through the third drain contact hole 152D extending through the gate insulation film 112 and the interlayer insulation film 116 and is connected to the third drain electrode 160.

The storage capacitor Cst, including a first terminal connected to a first node N1 and a second terminal connected to the second node N2, stores differential voltage between the first and second nodes N1 and N2. That is, the storage capacitor Cst is formed by overlapping with the second drain electrode 150 of the drive transistor DT and the second gate electrode 146 of the drive transistor DT via the gate insulation film 112. Even when the switching transistor ST is turned off, the drive transistor DT supplies consistent current to the light emitting device OLED using voltage charged in the storage capacitor Cst such that the light emitting device OLED emits light until a data signal of the next frame is supplied.

The light emitting device OLED includes an anode 122 connected to the second drain electrode 150 of the drive transistor DT, an organic light emission layer (not shown) formed on the anode 122, and a cathode (not shown) formed on the organic light emission layer while being connected to low-potential voltage VSS. In one embodiment, the organic light emission layer includes a hole-related layer, a light emission layer, and an electron-related layer sequentially stacked on the anode 122. Alternatively, organic light emission layer includes an electron-related layer, a light emission layer, and a hole-related layer sequentially stacked on the anode 122.

A repair pattern includes a first repair pattern RP1 formed between anodes 122 of light emitting devices OLED of vertically adjacent sub-pixels (i.e. between second nodes N2), and a second repair pattern RP2 formed between gate electrodes of drive transistors DT of sub-pixels adjacent to the each other along the data line and producing the same color (i.e. between first nodes N1).

Figure 5:
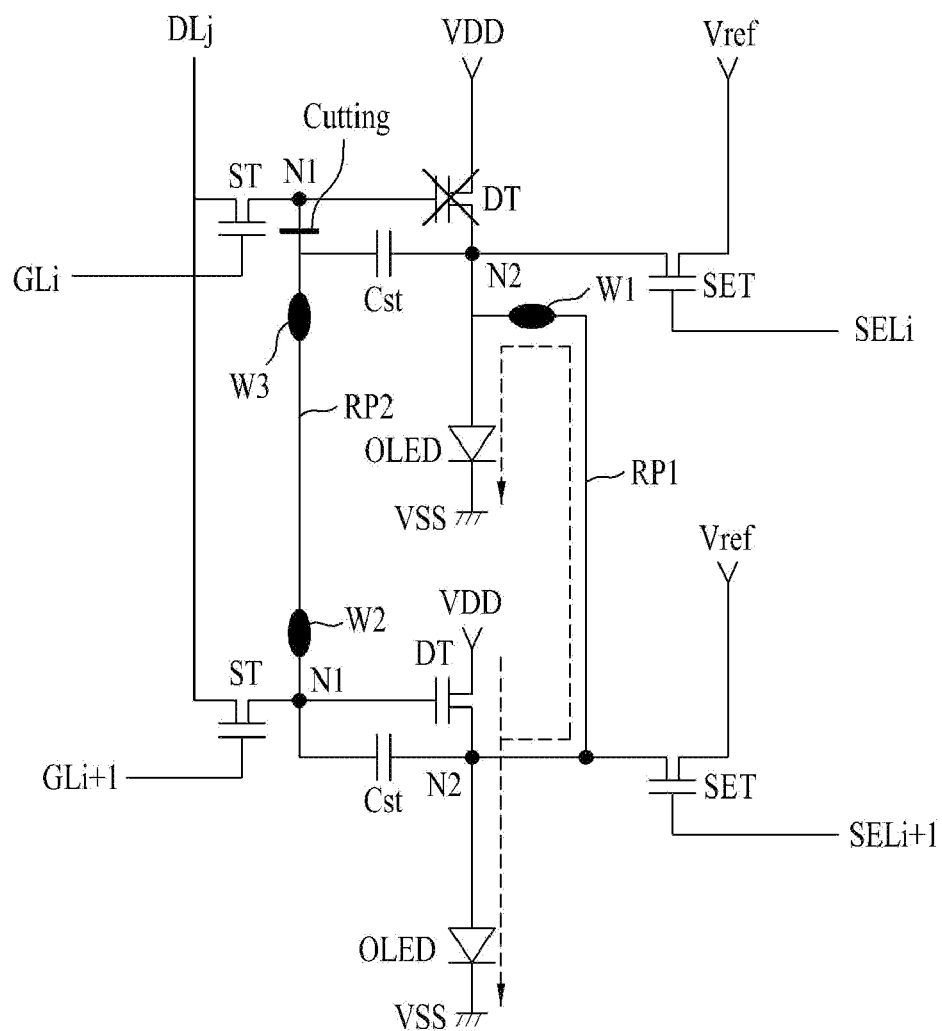
FIG. 5 is a circuit diagram illustrating a repairing method of the pixel circuit shown in FIG. 2.
Figure 6:
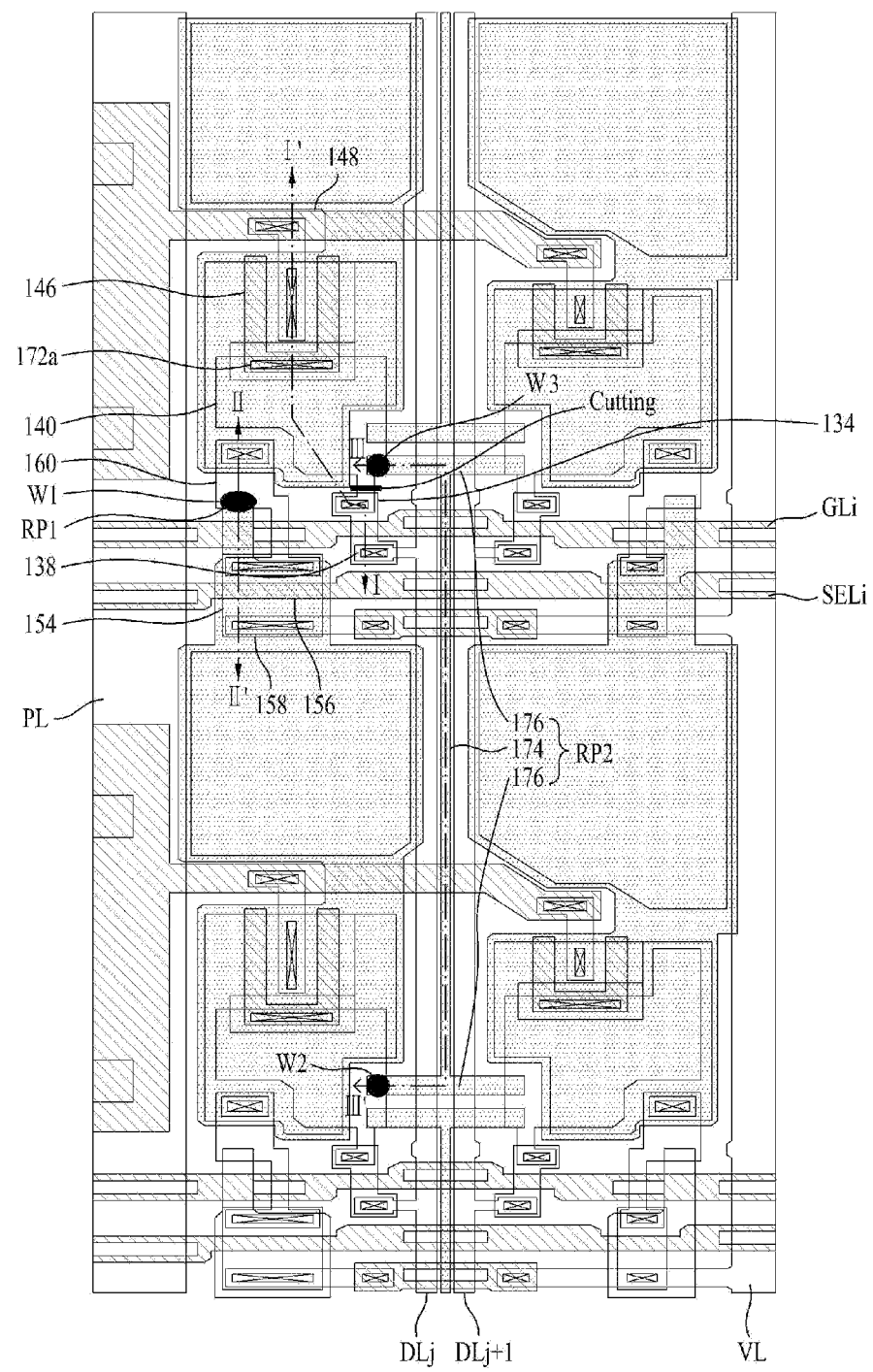
FIG. 6 is a plan view illustrating a repairing method of the pixel circuit shown in FIG. 3.
Figure 7:
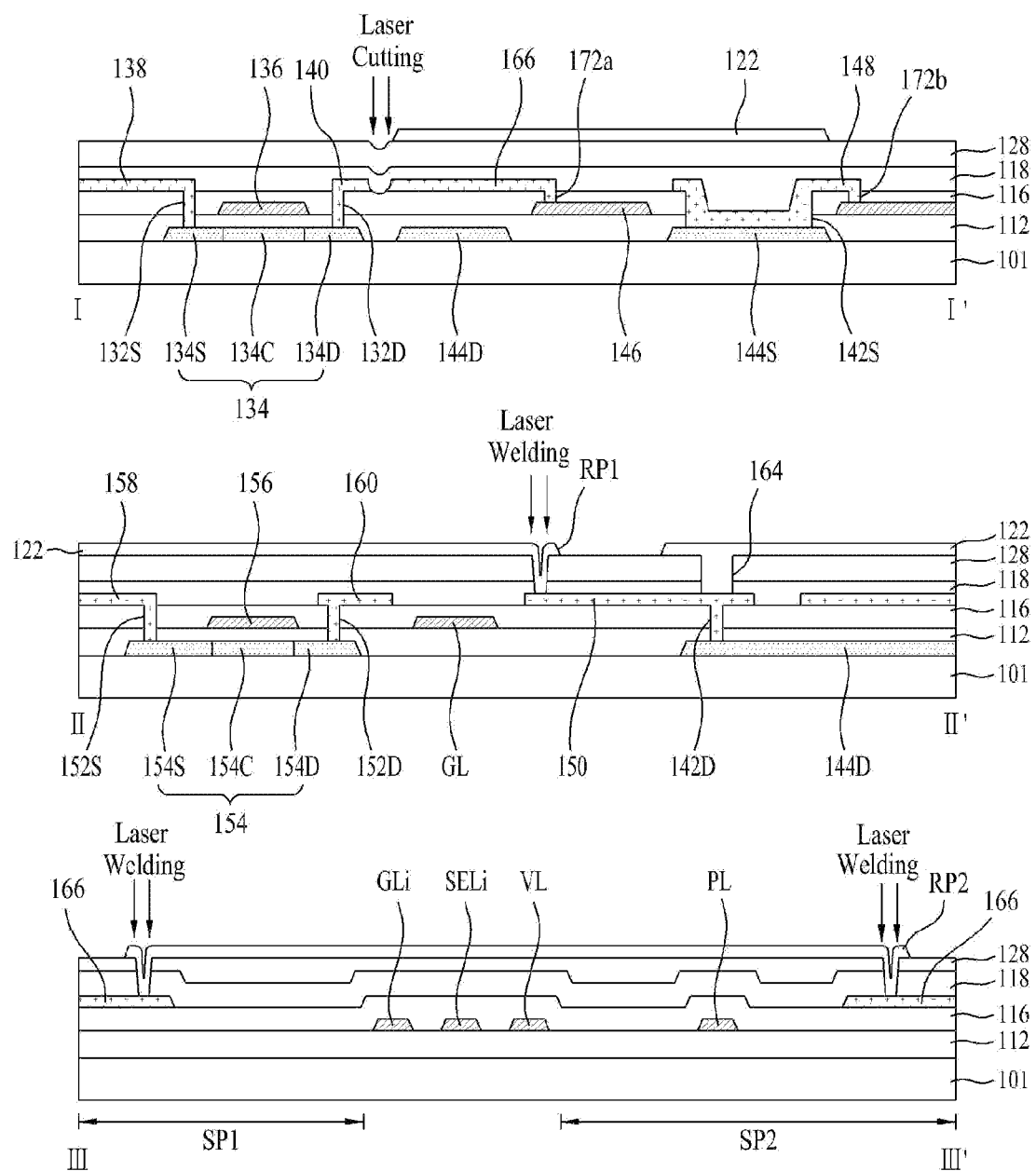
FIG. 7 is sectional views illustrating a repairing method of the pixel circuit shown in FIG. 4.

The first repair pattern RP1 extends from an anode 122 of a normal sub-pixel to a defective sub-pixel having a defective drive transistor DT. The first repair pattern RP1 overlaps with a second drain electrode 150 of a drive transistor DT connected to an anode 122 of a defective sub-pixel via the first and second passivation films 118 and 128. When the drive transistor DT is defective as shown in FIG. 5, therefore, laser welding is performed on an overlapping region between the second drain electrode 150 of the drive transistor DT of the defective sub-pixel and the first repair pattern RP1 as shown in FIGS. 5 through 7 (laser welding: W1). As a result, the anode 122 of the defective sub-pixel connected to the second drain electrode 150 of the drive transistor DT is electrically connected to the anode 122 of the normal sub-pixel connected to the first repair pattern RP1. Consequently, the defective sub-pixel located above the gate line GL may share drive current supplied to the light emitting device OLED of the normal sub-pixel located below the gate line GL. That is, when the sub-pixel located above the gate line GL is defective, the anode 122 of the defective sub-pixel is electrically connected to the anode 122 of the normal sub-pixel through the repairing process. As a result, drive current supplied to the normal sub-pixel is transmitted to the anode 122 of the defective sub-pixel via the first repair pattern RP 1, whereby the defective sub-pixel is operated using current provided by an operable drive transistor DT of an adjacent sub-pixel.

The second repair pattern PR2 is shared between sub-pixels adjacent along the same gate line and producing different colors. To this end, as shown in FIGS. 3 and 4, the second repair pattern PR2 includes a connection part 174 and sharing parts 176 formed at opposite sides of the connection part 174. The connection part 174 is formed between data lines DLj and DLj+1 of sub-pixels adjacent to each other long the gate line and producing different colors. The sharing parts 176 overlap with first terminals 166 of the storage capacitors extending from the first drain electrodes 140 of the switching transistors ST of the horizontally adjacent sub-pixels. The connection part 174 and the sharing parts 176 are formed on the second passivation film 128 as transparent conductive films made of the same material as the anode 122. Laser welding is applied to an overlapping region between one of the sharing parts 176 of the second repair pattern PR2 and a first terminal 166 of a storage capacitor Cst of a defective sub-pixel SP1 having a defective drive transistor DT and an overlapping region between the other sharing part 176 of the second repair pattern PR2 and a first terminal 166 of a storage capacitor Cst of a normal sub-pixel SP2 located below the defective sub-pixel SP1 based on the gate line GL (laser welding: W2 and W3).

As a result, the first terminals 166 of the storage capacitors Cst of the defective sub-pixel located above the gate line GL and a normal sub-pixel located below the same gate line GL are electrically connected to the sharing parts 176 of the second repair pattern PR2. Consequently, the storage capacitor Cst of the defective sub-pixel SP1 located above the gate line GL is connected in parallel to the storage capacitor of the drive transistor DT of the normal sub-pixel SP2 located below the gate line GL. The total capacitance of the storage capacitor of the defective sub-pixel SP1 and the storage capacitor of the normal sub-pixel SP2 connected in parallel to each other is double the capacitance of other normal sub-pixels. Consequently, the level of current transferred to the second gate electrode 146 of the drive transistor DT from the storage capacitor during light emission of the light emitting device OLED of each sub-pixel is increased. Due to the increased charge stored in the storage capacitors Cst in both sub-pixels, a higher level of current can be supplied to both light emitting devices of the two sub-pixels even when the data voltage at the data line DL remains the same.

In the present invention, therefore, the level of current supplied to a defective sub-pixel and a normal sub-pixel adjacent to the defective sub-pixel may be at least ⅔ of the level of current supplied to other normal sub-pixels. Consequently, it is possible to supply a higher level of current based on the same data voltage, thereby reducing the deviation and change of brightness over time.

Figure 8A:
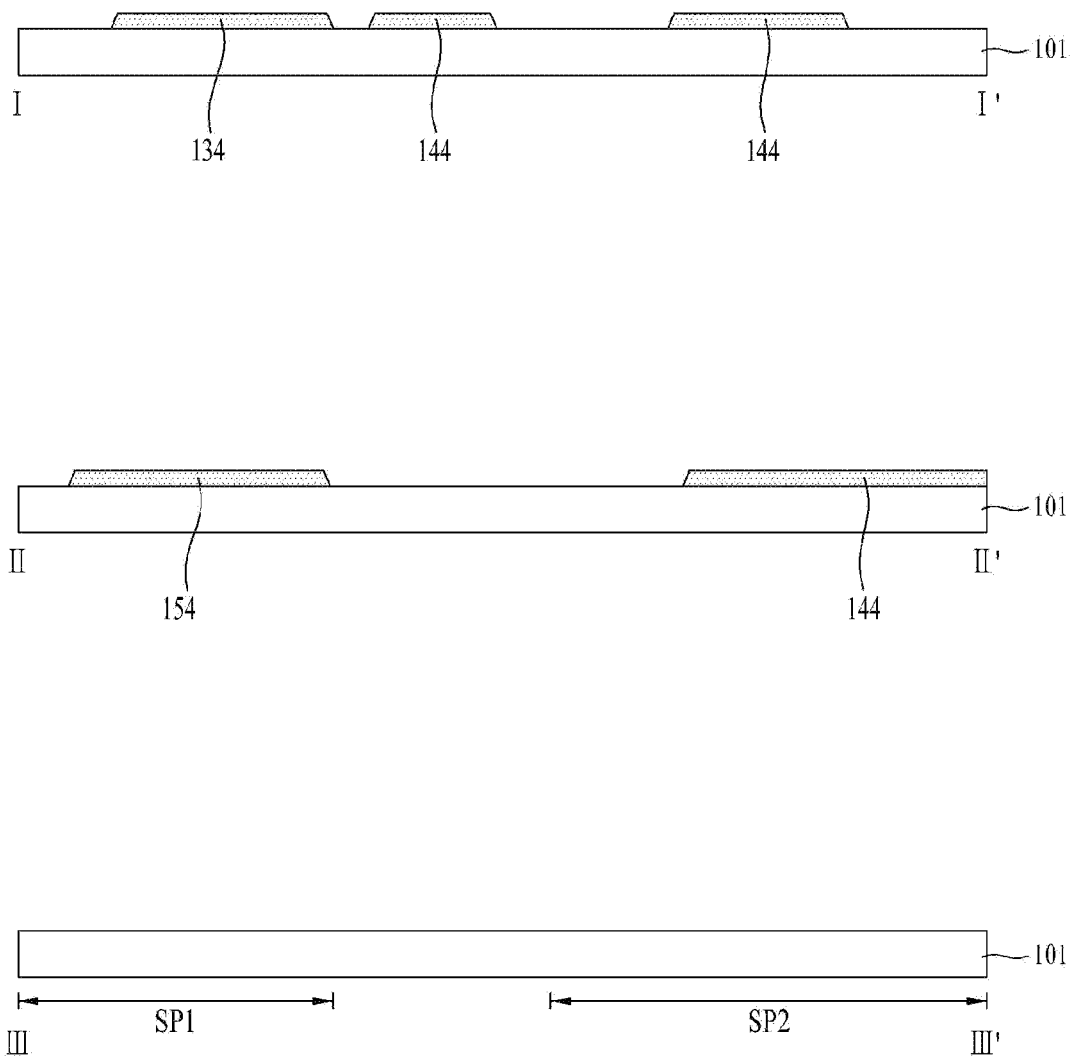

FIGS. 8A through 8G are cross-sectional views showing a manufacturing method of the organic light emitting display according to the embodiment of FIG. 7. Referring to FIG. 8A, first to third active layers 134, 144, and 154 are formed on a substrate 101 through a first mask process. Specifically, an amorphous silicon thin film is formed on a substrate 101 by deposition. The amorphous silicon thin film is crystallized to form a polysilicon thin film. Subsequently, the polysilicon thin film is patterned by photolithography and etching using a first mask to form first to third active layers 134, 144, and 154.

Figure 8B:
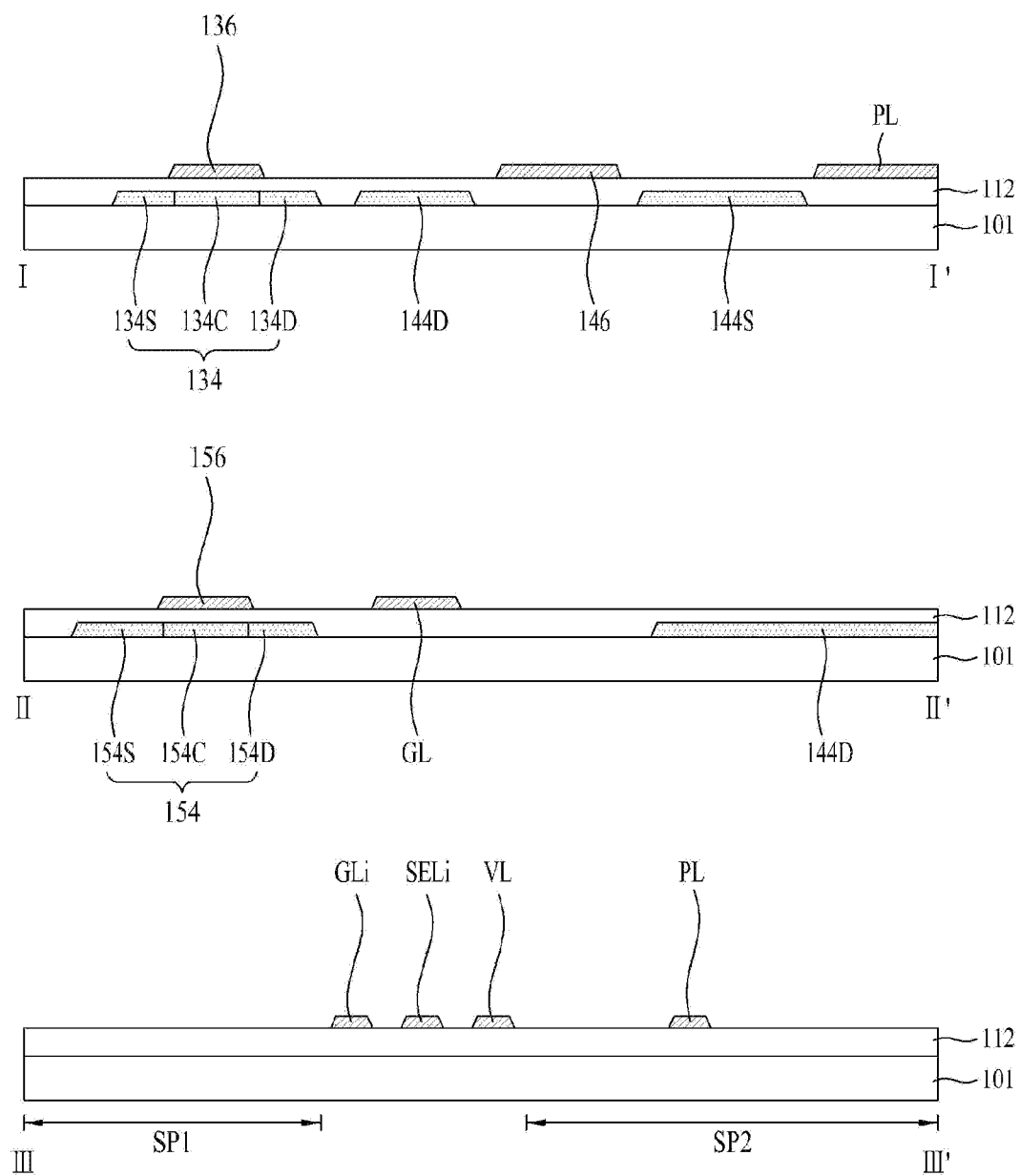

Referring to FIG. 8B, a gate insulation film 112 is formed on the substrate 101. Then, a gate line GL, a sensing line SEL, a high voltage line PL, a reference voltage line VL, and first to third gate electrodes 136, 146, and 156 are formed on the gate insulation film 112 through a second mask process.

Specifically, a gate insulation film 112 and a gate metal layer are sequentially formed on the substrate 101 formed with the first to third active layers 134, 144, and 154. Subsequently, the gate metal layer is patterned by photolithography and etching using a second mask to form a gate line GL, a sensing line SEL, a high voltage line PL, a reference voltage line VL, and first to third gate electrodes 136, 146, and 156.

The first to third active layers 134, 144, and 154 are doped with an n-type or p-type dopant Using the first to third gate electrodes 136, 146, and 156 as a mask to form source regions 134S, 144S, and 154S and drain regions 134D, 144D, and 154D of the first to third active layers 134, 144, and 154.

Referring to FIG. 8C, source and drain contact holes 132S, 142S, 152S, 132D, 142D, and 152D are formed to expose the first to third active layers 134, 144, and 154. An interlayer insulation film 116 having first and second contact holes 172a and 172b are formed through a third mask process.

Specifically, an interlayer insulation film 116 is formed on the gate insulation film 112 having the gate line GL, the sensing line SEL, the high voltage line PL, the reference voltage line VL, and the first to third gate electrodes 136, 146, and 156 formed thereon. Subsequently, source and drain contact holes 132S, 142S, 152S, 132D, 142D, and 152D extending through the interlayer insulation film 116 and the gate insulation film 112 to expose the source regions 134S, 144S, and 154S and the drain regions 134D, 144D, and 154D of the first to third active layers 134, 144, and 154, a first contact hole 172a to expose the second gate electrode 146 of the drive transistor, and a second contact hole 172b to expose the high voltage line PL are formed by photolithography and etching using a third mask.

Figure 8D:
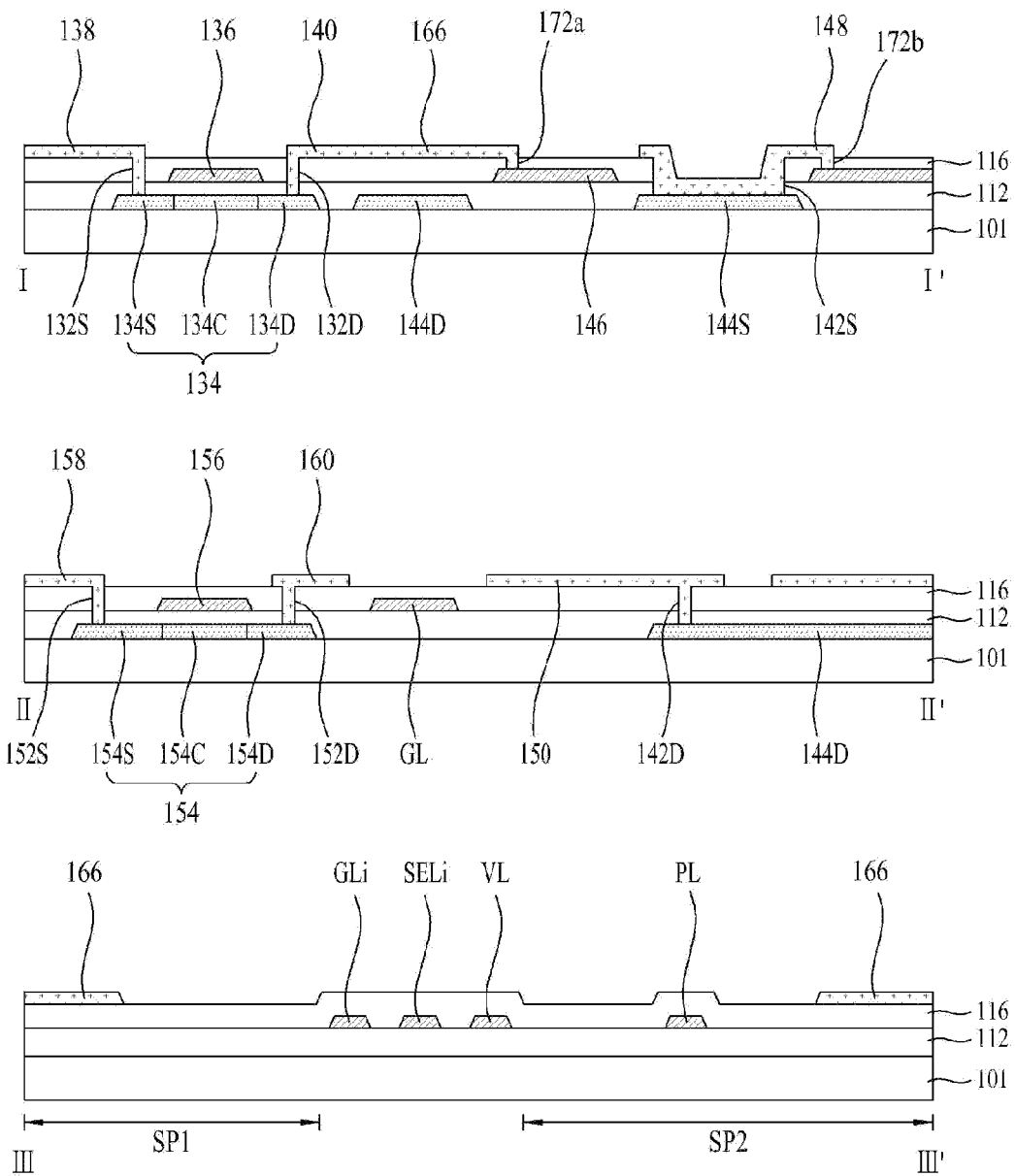

Referring to FIG. 8D, a data line DL, first and third source electrodes 138, 148, and 158, and first and third drain electrodes 140, 150, and 160 are formed on the interlayer insulation film 116 through a fourth mask process.

Specifically, a source/drain metal layer is formed on the interlayer insulation film 116 and then the source/drain metal layer is patterned by photolithography and etching using a fourth mask to form a data line DL, first and third source electrodes 138, 148, and 158, and first and third drain electrodes 140, 150, and 160. The first and third source electrodes 138, 148, and 158 are connected to the first to third source regions 134S, 144S, and 154S through the first to third source contact holes 132S, 142S, and 152S, respectively. The first and third drain electrodes 140, 150, and 160 are connected to the first to third drain regions 134D, 144D, and 154D through the first to third drain contact holes 132D, 142D, and 152D, respectively.

Figure 8E:
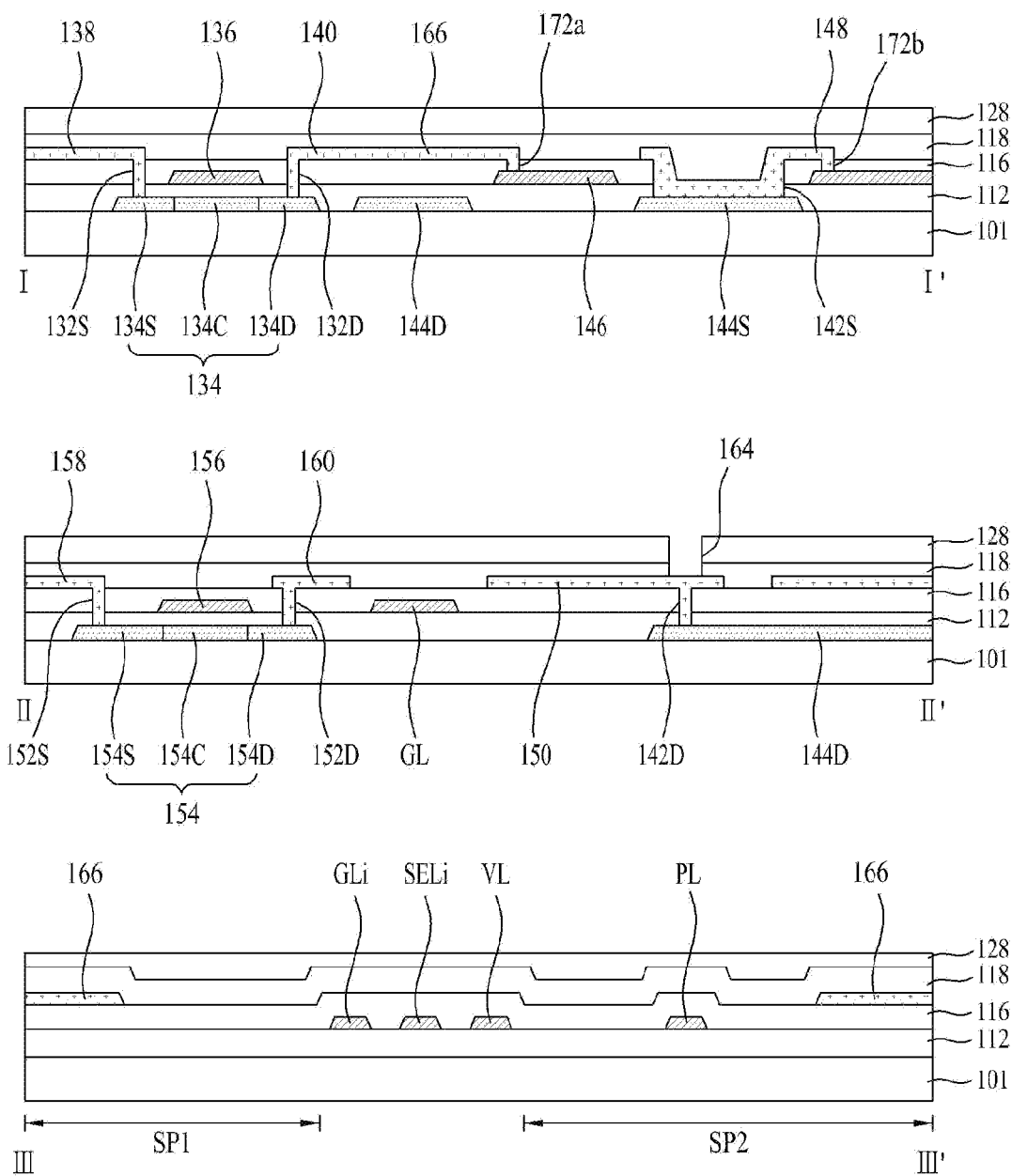

Referring to FIG. 8E, first and second passivation films 118 and 128 having a pixel contact hole 164 are formed on the substrate 101 having the data line DL, the first and third source electrodes 138, 148, and 158, and the first and third drain electrodes 140, 150, and 160.

Specifically, an inorganic insulation film and an organic insulation film, such as a photo acrylic resin, are sequentially formed on the substrate 101 having the data line DL, the first and third source electrodes 138, 148, and 158, and the first and third drain electrodes 140, 150, and 160 to form first and second passivation films 118 and 128. Subsequently, the first and second passivation films 118 and 128 are patterned by photolithography and etching using a fifth mask to form a pixel contact hole 164. The pixel contact hole 164 exposes the drain electrode 150 of the drive transistor in the corresponding sub-pixel region.

Figure 8F:
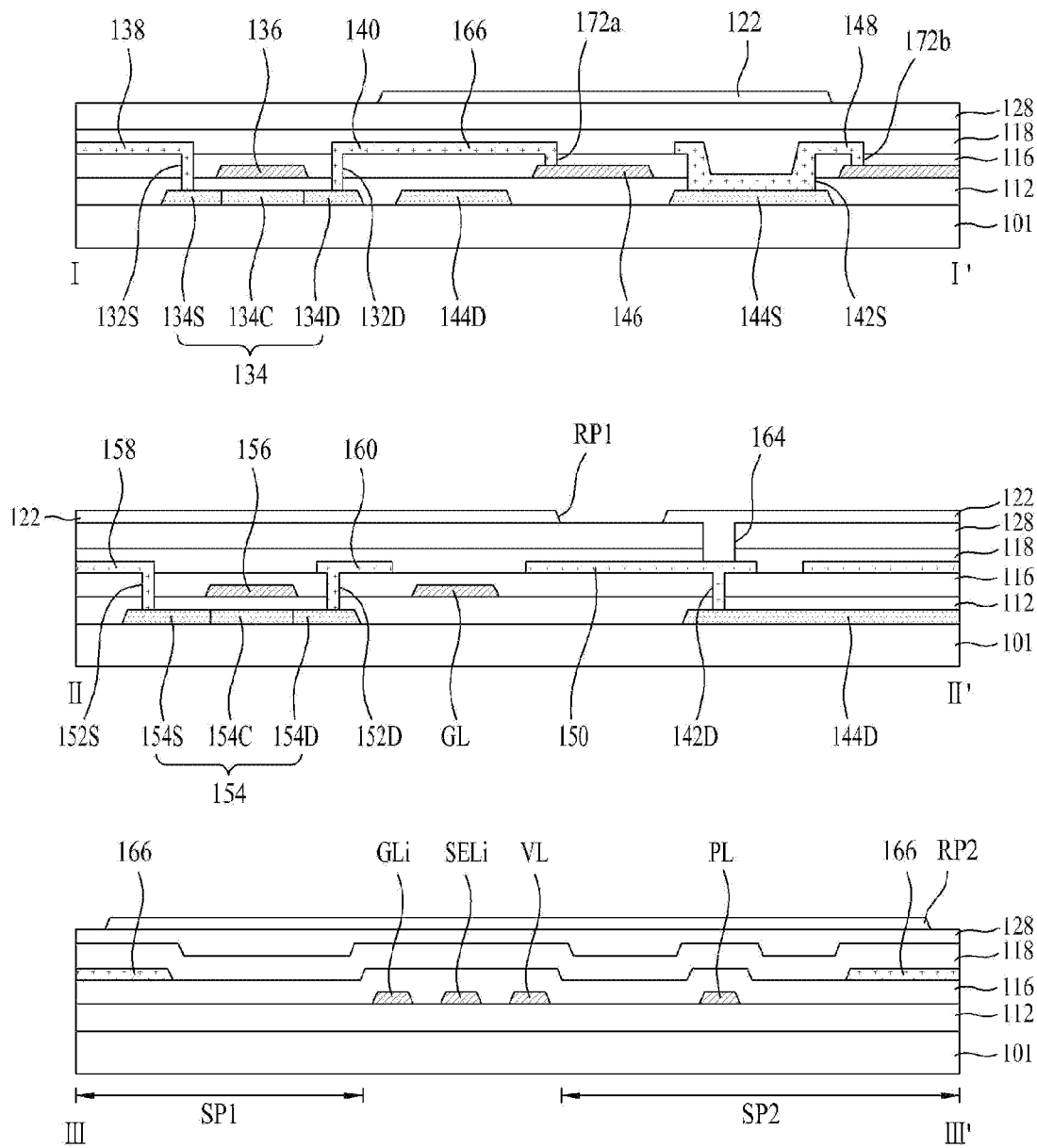

Referring to FIG. 8F, an anode 122 and first and second repair patterns RP1 and RP2 are formed on the substrate 101 having the first and second passivation films 118 and 128 provided with the pixel contact hole 164 formed thereon.

Specifically, a transparent conductive material, such as indium tin oxide (ITO) or indium zinc oxide (IZO), is formed on the substrate 101 having the first and second passivation films 118 and 128 provided with the pixel contact hole 164 formed thereon using a deposition method such as sputtering. Subsequently, the transparent conductive material is patterned by photolithography and etching using a sixth mask to form an anode 122 and first and second repair patterns RP1 and RP2.

Subsequently, an organic light emission layer and a cathode are sequentially formed on the substrate having the anode 122 and the first and second repair patterns RP1 and RP2 formed thereon.

Figure 8G:
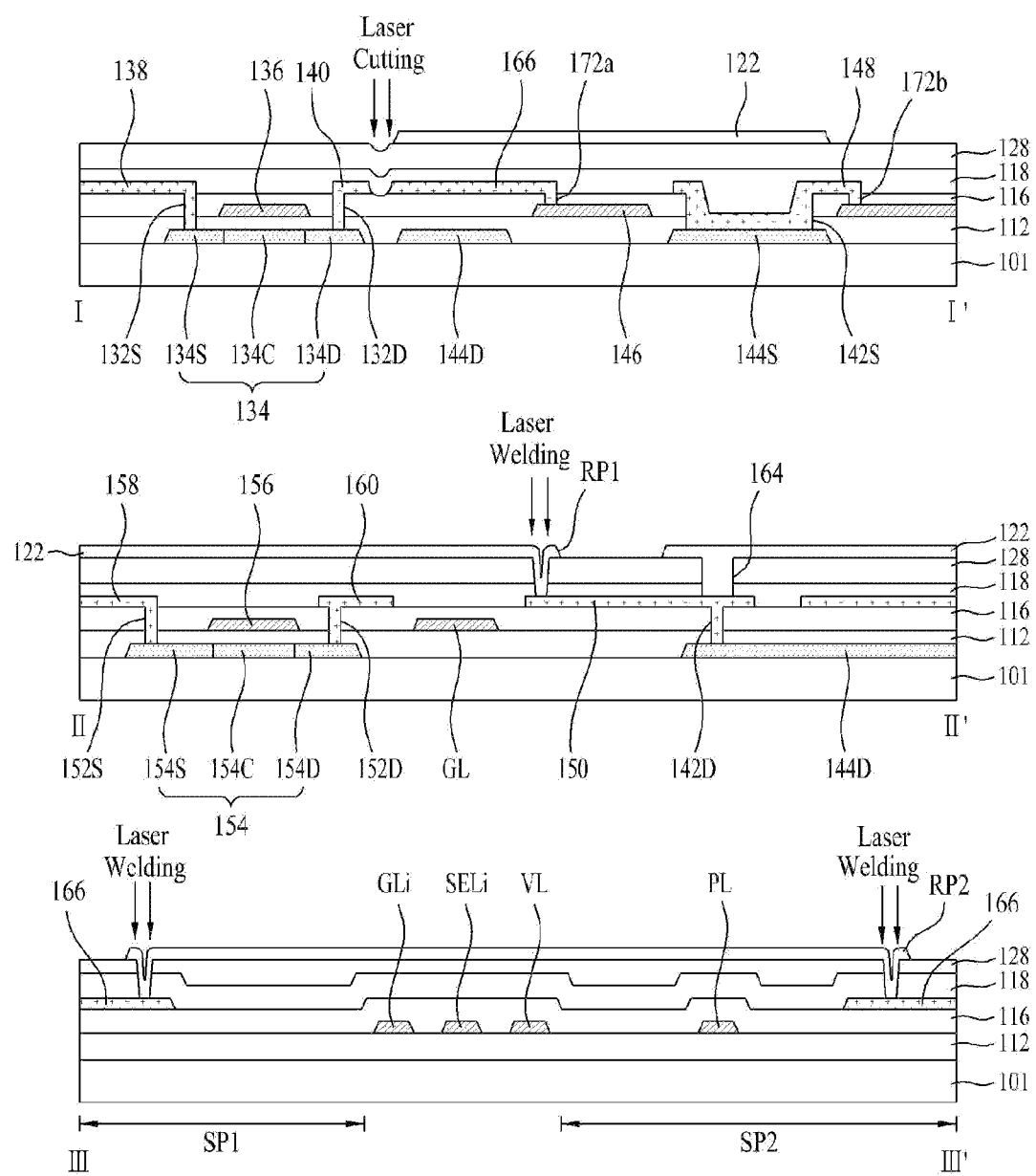

Referring to FIG. 8G, a repairing process using the first and second repair patterns RP1 and RP2 is performed when any defect of the drive transistor is found during an inspection process.

Specifically, when any defect of the drive transistor DT is found during an inspection process, laser cutting is performed on a region between the first drain electrode 140 of the switching transistor ST of the defective sub-pixel and the first terminal 166 of the storage capacitor to disconnect the first drain electrode 140 from the first terminal 166. Laser welding is performed on an overlapping region between the second drain electrode 150 of the defective drive transistor and the first repair pattern RP1 extending from the anode 122 to interconnect the second drain electrode 150 and the first repair pattern RP1. Laser welding is also performed on overlapping regions between the first terminal of the storage capacitor Cst of the defective sub-pixel and the second repair pattern RP2, and between first terminals of storage capacitors Cst of sub-pixels immediately above or below the defective sub-pixel and the second repair pattern RP2 to interconnect the first terminal of the storage capacitor Cst of the defective sub-pixel and the first terminals of the storage capacitors Cst of the sub-pixels immediately above or below the defective sub-pixel via the second repair pattern RP2.

Consequently, the defective sub-pixel located above the gate line GL may share drive current supplied to the light emitting device OLED of the normal sub-pixel located below the gate line GL. That is, when the sub-pixel located above the gate line GL is defective, the anode 122 of the defective sub-pixel is electrically connected to the anode 122 of the normal sub-pixel through the repairing process. As a result, drive current supplied to the normal sub-pixel is transmitted to the anode 122 of the defective sub-pixel through the first repair pattern RP1, whereby the defective sub-pixel normally operates.

In addition, the first terminal of the storage capacitor Cst of the defective sub-pixel is electrically connected to the first terminal of the storage capacitor Cst of the normal sub-pixel via the second repair pattern RP2 through the repairing process. Consequently, the storage capacitor of the defective sub-pixel and the storage capacitor Cst of the normal sub-pixel are connected in parallel to each other.

Figure 9:
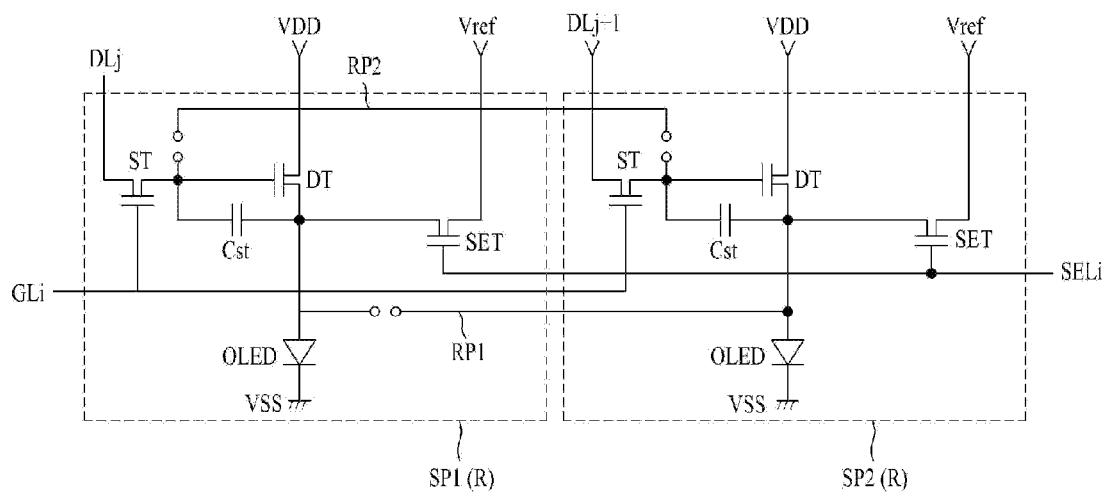
FIG. 9 is a circuit diagram showing an organic light emitting display according to a second embodiment of the present invention.

FIG. 9 is a view showing an organic light emitting display according to a second embodiment of the present invention. The organic light emitting display shown in FIG. 9 is identical to the organic light emitting display shown in FIG. 2 except that sub-pixels embodying the same colors are arranged along a gate line. A detailed description of elements of the organic light emitting display shown in FIG. 9 identical to those of the organic light emitting display shown in FIG. 2 is omitted herein for the sake of brevity.

In the embodiment of FIG. 9, a repair pattern includes a first repair pattern RP1 formed between anodes 122 of light emitting devices OLED of horizontally adjacent sub-pixels embodying the same color and a second repair pattern RP2 formed between gate electrodes of drive transistors DT of horizontally adjacent sub-pixels.

Figure 10:
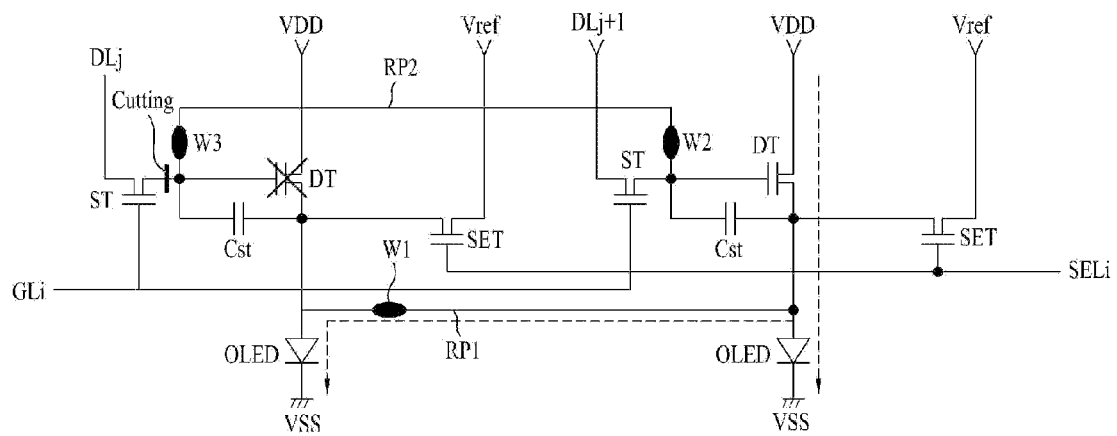
FIG. 10 is a circuit diagram illustrating a repairing method of a pixel circuit shown in FIG. 9.

The first repair pattern RP1 extends from an anode 122 of a normal sub-pixel adjacent to a defective sub-pixel having a defective drive transistor DT via a data line. When the drive transistor DT is defective, therefore, laser welding is applied to an overlapping region between the anode of the defective sub-pixel and the first repair pattern RP1 as shown in FIG. 10 (laser welding: W1). As a result, the anode 122 of the defective sub-pixel is electrically connected to the anode 122 of the normal sub-pixel connected to the first repair pattern RP1. Consequently, the defective sub-pixel located above the gate line GL may share drive current supplied to the light emitting device OLED of the normal sub-pixel adjacent to the defective sub-pixel via the data line. That is, when the sub-pixel located at the left or the right side of the gate line GL is defective, the anode 122 of the defective sub-pixel is electrically connected to the anode 122 of the normal sub-pixel through the repairing process. As a result, drive current supplied to the normal sub-pixel is transmitted to the anode 122 of the defective sub-pixel via the first repair pattern RP1, whereby the defective sub-pixel normally operates.

Laser welding is performed on overlapping regions between the second repair pattern PR2 and a first terminal 166 of a storage capacitor Cst of a defective sub-pixel SP1 having a defective drive transistor DT and between the second repair pattern PR2 and a first terminal 166 of a storage capacitor Cst of a normal sub-pixel SP2 located below the defective sub-pixel SP1 based on the gate line GL (laser welding: W2 and W3). As a result, the first terminals 166 of the storage capacitors Cst of the defective and normal sub-pixels respectively located at the left and right sides of the gate line GL are electrically connected to each other. Consequently, the storage capacitor of the defective sub-pixel SP1 is connected in parallel to the storage capacitor of the normal sub-pixel SP2. The total capacitance of the storage capacitor of the defective sub-pixel SP1 and the storage capacitor of the normal sub-pixel SP2 which are connected in parallel to each other is increased to be twice the capacitance of the storage capacitor Cst of each normal sub-pixel. Consequently, the level of current transmitted to the second gate electrode 146 of the drive transistor DT connected to the storage capacitor during light emission of the light emitting device of each sub-pixel is increased and, therefore, a high level of current based on the same data voltage can be supplied to the light emitting device. In the present invention, therefore, it is possible to supply a higher level of current based on the same data voltage, thereby reducing deviation and change of brightness over time.

Figure 11:
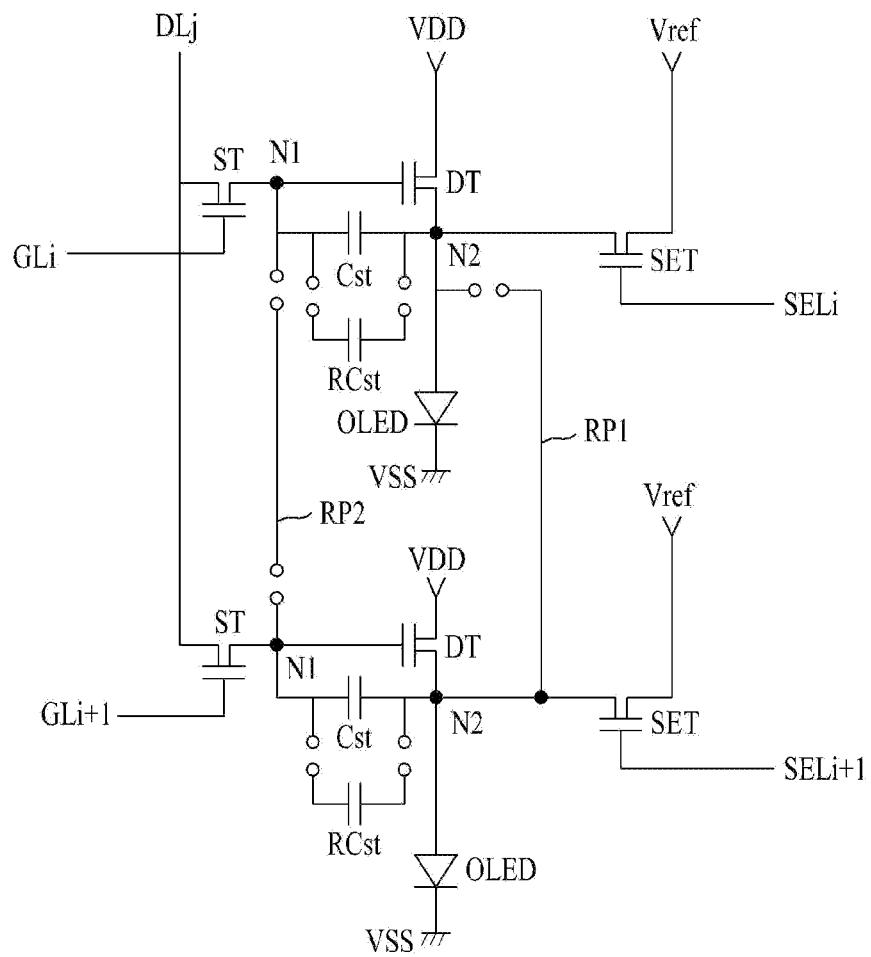
FIG. 11 is a circuit diagram showing an organic light emitting display according to a third embodiment of the present invention.

FIG. 11 is a circuit diagram showing an organic light emitting display according to a third embodiment of the present invention. The organic light emitting display shown in FIG. 11 is identical to the organic light emitting display shown in FIG. 2 except that a repair capacitor is further provided. A detailed description of elements of the organic light emitting display shown in FIG. 11 identical to those of the organic light emitting display shown in FIG. 2 is omitted herein for the sake of brevity.

As previously described above with reference to FIG. 2, a repair pattern includes a first repair pattern RP1 formed between anodes 122 of light emitting devices OLED of vertically adjacent sub-pixels and a second repair pattern RP2 formed between gate electrodes of drive transistors DT of vertically adjacent sub-pixels embodying the same color.

Figure 12:
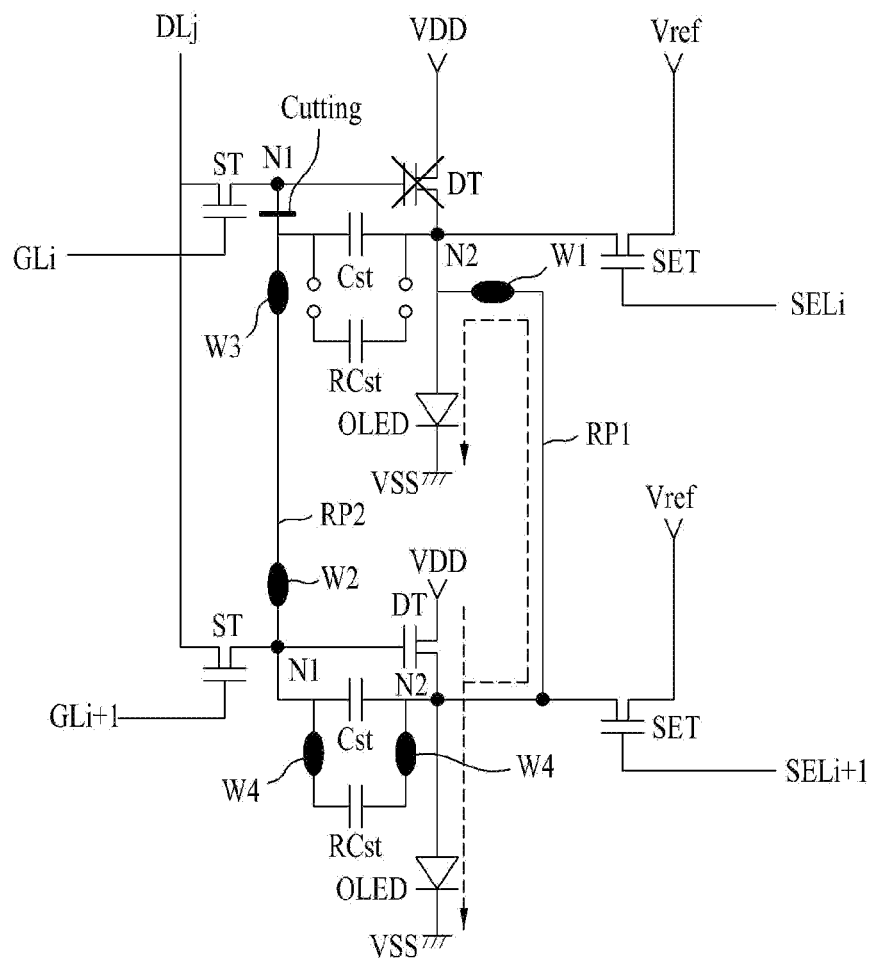
FIG. 12 is a circuit diagram illustrating a repairing method of a pixel circuit shown in FIG. 11.

In each sub-pixel, a repair capacitor RCst separate from a storage capacitor Cst is provided. When the drive transistor DT is defective, laser welding (W4) is performed as shown in FIG. 12 such that the repair capacitor RCst is connected in parallel to at least one selected from between the storage capacitor Cst of the defective sub-pixel SP1 and a storage capacitor Cst of a normal sub-pixel adjacent to the defective sub-pixel SP1. As a result, the storage capacitor Cst of the defective sub-pixel SP1 located above the gate line GL is connected in parallel to the storage capacitor Cst of the drive transistor DT of the normal sub-pixel SP2 located below the gate line GL and is also connected in parallel to the repair capacitor RCst. The total capacitance of the storage capacitor Cst of the defective sub-pixel SP1, the storage capacitor Cst of the normal sub-pixel SP2, and the repair capacitor RCst which are connected in parallel to each other is increased by several times the capacitance of the storage capacitor Cst of each normal sub-pixel. Consequently, the amount of data transmitted to the second gate electrode 146 of the drive transistor DT connected to the storage capacitor Cst during light emission of the light emitting device of each sub-pixel is increased and, therefore, a higher level of current based on the same data voltage can be supplied to the light emitting device due to the increased in amount of data transmission. In the present invention, therefore, it is possible to supply a larger amount of current based on the same data voltage, thereby reducing deviation and change of brightness over time.

In the above embodiments, the organic light emitting display is configured to have a pixel structure having three transistors and one storage capacitor. However, the present invention is not limited thereto. The organic light emitting display may have various pixel structures.

As is apparent from the above description, in the organic light emitting display and the repairing method of the same, the first nodes and the second nodes of the adjacent sub-pixels are electrically connected to each other via the repair pattern. That is, the storage capacitors of the defective sub-pixel and the normal sub-pixel are connected in parallel to each other. Consequently, the amount of data transmitted to the second gate electrode of the drive transistor is increased and, therefore, a larger amount of current based on the same data voltage can be supplied to the light emitting device. In the present invention, therefore, it is possible to supply a higher level of current based on the same data voltage, thereby reducing deviation and change of brightness over time.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
a gate line and a data line on a substrate arranged to intersect with each other and define a first sub-pixel region;
a light emitting device in the first sub-pixel region, the light emitting device having an anode and a cathode;
a switching transistor in the first sub-pixel region, the switching transistor configured to supply data voltage of the data line to a first node in response to applying a scan signal to the gate line;
a drive transistor in the first sub-pixel region, the drive transistor configured to control emission of the light emitting device according to the voltage of the first node;
a storage capacitor in the first sub-pixel region, the storage capacitor comprising a first terminal connected to the first node and a second terminal connected to a second node connected to the anode;
a first repair pattern located between the second node of the first sub-pixel region and another second node of a second sub-pixel region adjacent to the first sub-pixel region; and
a second repair pattern located between the first node of the first sub-pixel region and another first node of the second sub-pixel region.

2. The organic light emitting display according to claim 1, wherein the first and second repair patterns are composed of the same material as the anode and are located on the same layer as the anode.

3. The organic light emitting display according to claim 2, wherein the second repair pattern comprises:
a connection part located between data lines or gate lines located between the first and the second sub-pixel regions for producing different colors; and
sharing parts extending from both sides of the connection part to overlap with a storage capacitor of the second sub-pixel region and a storage capacitor of a third sub-pixel region.

4. The organic light emitting display according to claim 3, wherein, when the drive transistor of the first sub-pixel region is defective:
a path between the storage capacitor and the drive transistor of the first sub-pixel region is disconnected, the anode of the first sub-pixel region and an anode of the second sub-pixel region is connected via the first repair pattern, and the storage capacitor of the first sub-pixel region and a storage capacitor of the second sub-pixel are connected in parallel via the second repair pattern.

5. The organic light emitting display according to claim 4, further comprising a repair capacitor in the first sub-pixel region, the repair capacitor connected in parallel to the storage capacitor of the first sub-pixel region when the drive transistor of the first sub-pixel region is defective.

6. An organic light emitting display comprising:
a first sub-pixel comprising:
a first light emitting device,
a defective drive transistor connected to the first light emitting device, and
a first storage capacitor having a first terminal and a second terminal, the first terminal connected to the first light emitting diode;
a second sub-pixel adjacent to the first sub-pixel, the second sub-pixel comprising:
a second light emitting device,
an operable drive transistor between a reference voltage and the second light emitting device,
a second storage capacitor having a first terminal connected to the second light emitting diode and a second terminal connected to a gate of the operable drive transistor; and
a repair path connecting the second terminal of the first storage capacitor to the second terminal of the second storage capacitor.

7. The organic light emitting display of claim 6, wherein the second sub-pixel further comprises a switching transistor coupled between a data line and the operable drive transistor, the switching transistor having a gate connected to a gate line, the second terminal of the second storage capacitor further connected to the switching transistor.

8. The organic light emitting display of claim 6, further comprising another repair path connecting the first terminals of the first and second storage capacitors.

9. The organic light emitting display of claim 7, wherein the first sub-pixel further comprises a switching transistor coupled between a data line and the defective drive transistor, the second terminal of first storage capacitor disconnected from a gate of the defective drive transistor.

10. The organic light emitting display of claim 6, wherein the repair path comprises welding.

11. The organic light emitting display of claim 6, wherein the first and second sub-pixels are connected to a same data line.

12. The organic light emitting display of claim 6, wherein the first and second sub-pixels are connected to a same gate line.

13. The organic light emitting display of claim 6, wherein at least one of the first sub-pixel and the second sub-pixel include a repair capacitor connected in parallel to the first storage capacitor or the second storage capacitor.

14. A method of repairing an organic light emitting display, comprising:
determining that a first drive transistor in a first sub-pixel is defective;
responsive to determining that the first drive transistor is defective, connecting a terminal of a first storage capacitor of the first sub-pixel to a corresponding terminal of a second storage capacitor in a second sub-pixel adjacent to the first sub-pixel and having an operable drive transistor, the operable drive transistor of the second sub-pixel operated by voltage at the terminal of the first storage capacitor and the corresponding terminal of the second storage capacitor, current through a first light emitting device of the first sub-pixel and a second light emitting device provided through the operable drive transistor; and
disconnecting the terminal of the first storage capacitor from a gate of the first drive transistor.

15. The method of claim 14, wherein connecting the terminal of the first storage capacitor to the corresponding terminal of the second storage capacitor comprises performing welding on a repair path between the first sub-pixel and the second sub-pixel.

16. The method of claim 14, further comprising connecting the second drive transistor to another terminal of the first storage capacitor and the first light emitting device.

17. The method of claim 16, wherein connecting the second drive transistor comprises performing welding on a repair path between the first sub-pixel and the second sub-pixel.

18. The method of claim 14, wherein disconnecting the terminal of the first storage capacitor comprises performing laser cutting on a path between the terminal and a gate of the first drive transistor.

19. The method of claim 14, further comprising connecting a repair capacitor in parallel with at least one of the first storage capacitor and the second storage capacitor responsive to determining that the first drive transistor is defective.

\* \* \* \* \*